US011543452B1

(12) United States Patent
Bandyopadhyay et al.

(10) Patent No.: US 11,543,452 B1
(45) Date of Patent: Jan. 3, 2023

(54) HIERARCHICAL ACCESS SIMULATION FOR SIGNALING WITH MORE THAN TWO STATE VALUES

(71) Applicant: Xilinx, Inc., San Jose, CA (US)

(72) Inventors: Saikat Bandyopadhyay, San Jose, CA (US); Rajvinder S. Klair, San Jose, CA (US); Dhiraj Kumar Prasad, Hyderabad (IN); Ender Tunc Eroglu, San Jose, CA (US); Rupendra Bakoliya, Hyderabad (IN); Jayashree Rangarajan, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 329 days.

(21) Appl. No.: 17/014,128

(22) Filed: Sep. 8, 2020

(51) Int. Cl.
*G06F 11/00* (2006.01)
*G01R 31/3183* (2006.01)
*G06F 30/3308* (2020.01)

(52) U.S. Cl.
CPC ........... *G01R 31/318364* (2013.01); *G01R 31/318314* (2013.01); *G06F 30/3308* (2020.01)

(58) Field of Classification Search
CPC .... G01R 31/318364; G01R 31/318314; G01R 31/318342; G01R 31/318357; G06F 30/3308; G06F 30/33; G06F 30/20
See application file for complete search history.

(56) References Cited

U.S. PATENT DOCUMENTS

| 2003/0208723 | A1* | 11/2003 | Killian | G06F 30/30 716/102 |
| 2021/0116497 | A1* | 4/2021 | Wang | G01R 31/31723 |
| 2022/0187367 | A1* | 6/2022 | Yi | G01R 31/318321 |

* cited by examiner

*Primary Examiner* — Christine T. Tu
(74) *Attorney, Agent, or Firm* — Luke Choi (57) ABSTRACT

A method includes instantiating a simulation of an electronic design for a device under test (DUT) in hardware design language responsive to a user selection thereof. A subset of leaf nodes from a plurality of leaf nodes from the electronic design with input/output signaling of more than two values is identified. A hierarchical path for each leaf node of the plurality of leaf nodes of the electronic design for the DUT with respect to a testbench is calculated. A bypass module for the subset of leaf nodes is generated. The bypass module is generated in response to detecting presence of the subset of leaf nodes in the electronic design with input/output signaling of more than two values. The bypass module facilitates communication between the testbench and the subset of leaf nodes. Leaf nodes other than the subset of leaf nodes communicate with the testbench without communicating through the bypass module.

20 Claims, 11 Drawing Sheets

FIGURE 6

HIERARCHICAL ACCESS SIMULATION FOR SIGNALING WITH MORE THAN TWO STATE VALUES

TECHNICAL FIELD

The disclosure generally relates to simulation of electronic designs, particularly simulation of electronic designs with signaling having more than two state values.

BACKGROUND

Typically, electronic designs are simulated once they are designed. Unfortunately, simulators typically support a two-state signalling scheme. Moreover, on the implementation side a signalling scheme with greater than two states is difficult to implement, e.g., on a field programmable gate array (FPGA) bitstream, because the data type on the chip is represented as a two-level signal only. For example, even though a signalling scheme greater than two states, such as pulse amplitude modulation PAM4, PAM8, etc., push more data in the same transmission interval and have a higher throughput, they are very difficult to implement since the data type on the chip is represented as a two-level signal. The limitations of simulators to handle only a two-state signalling scheme are exacerbated in light of exponential growth of data size requiring high-speed transmission and utilizing signalling schemes such as PAM4, PAM8, etc. to achieve a higher speed and an increased throughput.

SUMMARY

Accordingly, it is desirable to enable simulators to simulate a signaling scheme with greater than two-state values without changing the design configuration or the simulator. In some embodiments a bypass module is generated when a leaf node, e.g., a primitive, in the electronic design uses a signaling scheme with more than two-state values, e.g., analog signaling, PAM4, PAM8, etc. Accordingly, the values from the testbench are propagated to the leaf node (e.g., primitive) using the bypass module whereas values from the testbench propagate to other nodes using two-state values without going through the bypass module.

In some embodiments, a method includes receiving an electronic design for a device under test (DUT) in hardware design language (HDL), e.g., a very high speed integrated circuit (VHSIC) hardware description language (VHDL), a Verilog base, etc. A simulation of the electronic design is instantiated, e.g., by a user. It is determined whether a signaling design with more than two values is used for at least one leaf node of a plurality of leaf nodes. A hierarchical path to the plurality of leaf nodes of the electronic design for the DUT with respect to a testbench is calculated. A bypass module is generated in response to determining that the signaling design with more than two values is used for the at least one leaf node of the plurality of leaf nodes. The bypass module is in HDL and facilitates communication between the testbench and the at least one leaf node. The testbench communicates to other leaf nodes of the plurality of leaf nodes of the electronic design for the DUT using a signaling design with two values without communicating through the bypass module.

The method also includes re-calculating the hierarchical path to the plurality of leaf nodes with respect to the test bench. The bypass module may be inserted, e.g., by a user in some examples, parallel to the electronic design for the DUT. In some embodiments, the simulation may be relaunched, e.g., by a user. It is appreciated that in some embodiments, the user may be prompted to insert the bypass module in the testbench. In some nonlimiting examples, the simulation is relaunched and an error message is rendered in response to detecting a hierarchical bypass port and further responsive to absence of the bypass module in the testbench.

It is appreciated that the signaling design with more than two values is a PAM4 signaling or a PAM8 signaling. In some nonlimiting example, the signaling design with more than two values is an analog signaling. It is appreciated that the simulation may only support the signaling design with two values. According to some nonlimiting examples, a leaf node is a primitive and includes one of a buffer, D flip-flop, or edge triggered flip-flop. It is appreciated that the bypass module includes sample test vector defining input waveform. In some embodiments, the hierarchical path for testbench is calculated using a design-graph application programming interface (API). In some nonlimiting examples, the calculated hierarchical path is for hierarchical path of ports.

In some embodiments, a method includes instantiating a simulation of an electronic design for a DUT in HDL responsive to a user selection thereof. A subset of leaf nodes from a plurality of leaf nodes from the electronic design with input/output signaling of more than two values is identified. A hierarchical path for each leaf node of the plurality of leaf nodes of the electronic design for the DUT with respect to a testbench is calculated. A bypass module associated with the subset of leaf nodes is generated. The bypass module is generated in response to detecting presence of the subset of leaf nodes in the electronic design with input/output signaling of more than two values. The bypass module facilitates communication between the testbench and the subset of leaf nodes and wherein leaf nodes other than the subset of leaf nodes communicate with the testbench without communicating through the bypass module.

The bypass module is in HDL, in some examples. The method may further include re-calculating the hierarchical path to the plurality of leaf nodes with respect to the test bench and inserting the bypass module parallel to the electronic design for the DUT. The simulation may be relaunched. In some nonlimiting examples the user may be prompted to insert the bypass module in the testbench. An error message may be rendered in response to detecting a hierarchical bypass port and further responsive to absence of the bypass module in the testbench.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein relate to enabling simulators to simulate a signaling scheme with greater than two-state values. In some embodiments a bypass module is generated when a leaf node, e.g., a primitive, in the electronic design uses a signaling scheme with greater than two-state values, e.g., analog signaling, PAM4, PAM8, etc. Accordingly, the values from the testbench are propagated to the leaf node (e.g., primitive) using the bypass module whereas values from the testbench propagate to other nodes using a two-state values without going through the bypass module.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1:
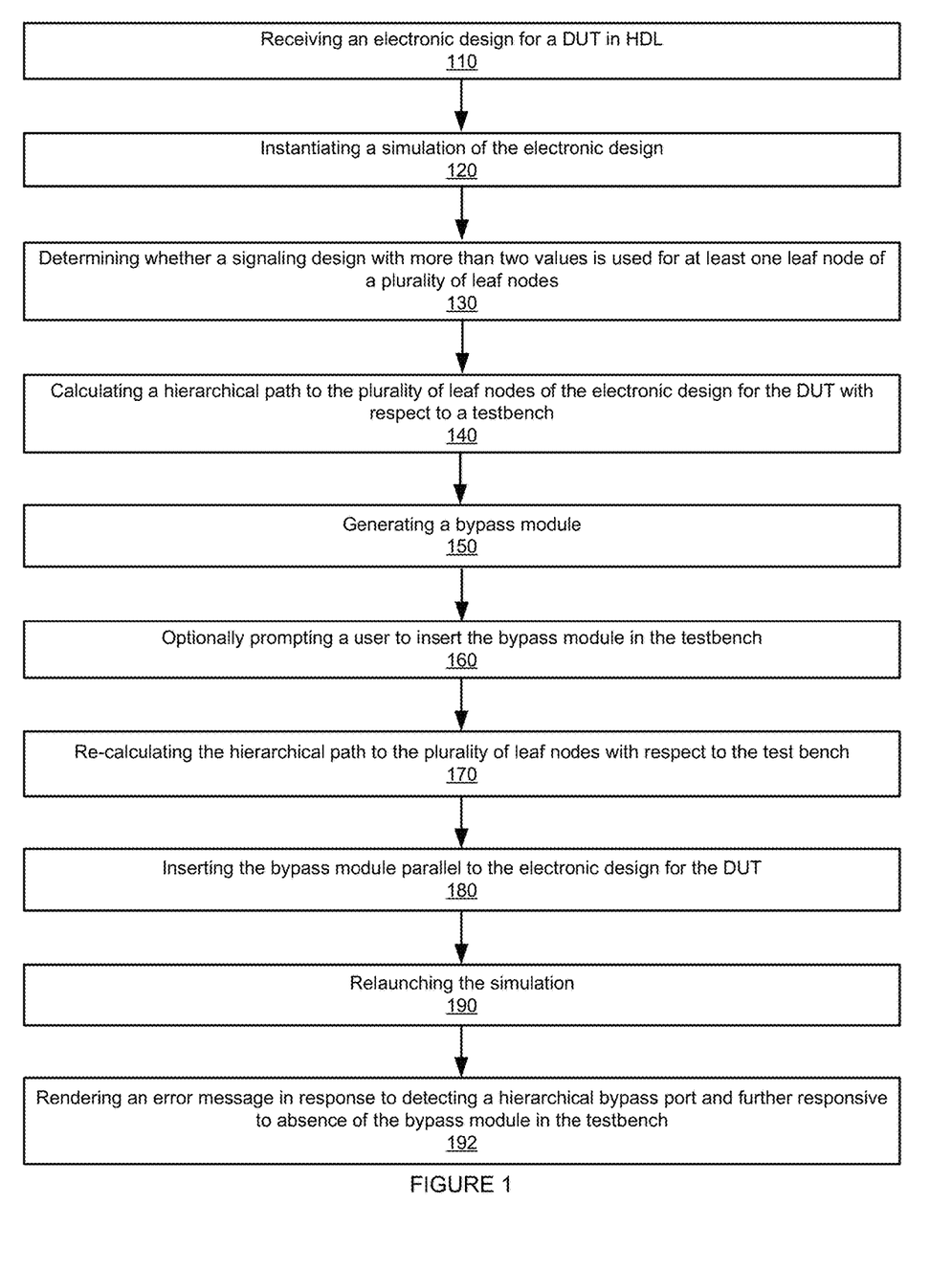
FIG. 1 shows a method of generating a bypass module when a signaling scheme with more than two values is detected, according to some examples.

FIG. 1 shows a method of generating a bypass module when a signaling scheme with more than two values is detected, according to some examples. In one nonlimiting example, at step 110, an electronic design for a DUT is received. The design may be in HDL, e.g., VHDL, Verilog base, etc. At step 120, simulation may be instantiated after the electronic design is received. In some nonlimiting examples, the simulation is instantiated in response to a user input, e.g., user pressing the simulation button on a graphical user interface (GUI). In some nonlimiting examples, the simulation supports a signaling scheme with two values. At step 130, it is determined whether a signaling design with more than two values, e.g., PAM4, PAM8, analog signaling, etc., is used for at least one or more leaf nodes of the plurality of leaf nodes in the electronic design. For example, in one nonlimiting example it is determined whether a leaf node (also referred to as a primitive, e.g., Gigabit Transceiver (GTM Dual) uses a PAM4 signaling. It is appreciated that leaf nodes may include any primitive that supports a PAM4 signaling. Typically, a PAM4 signalling defines 2 bits of data (0 or 1) as a single amplitude level, thereby generating four distinct encoding levels (00, 01, 10, 11) to represent four unique discrete values, e.g., 0, 1, 2, and 3, to increase the throughput. At step 140, a hierarchical path to the leaf nodes of the electronic design of the DUT with respect to the testbench is calculated. In some nonlimiting examples, the hierarchical path may be for the port(s) of the primitive or leaf node. According to some embodiments, the hierarchical path for the testbench may be calculated using a design-graph application peripheral interface (API).

According to some embodiments, at step 150, a bypass module is generated for leaf nodes and primitives with a signaling scheme with greater than 2 values. It is appreciated that in some embodiments, the bypass module is generated in HDL and facilitates the communication between the testbench and the leaf node having a signaling scheme with greater than 2 values. It is appreciated that other leaf nodes and primitives that use a signaling scheme with only 2 values communicate to the testbench without going through the bypass module. In some embodiments, the bypass module includes sample test vector defining input waveform. It is appreciated that according to one nonlimiting example, the bypass module assigns input analog values from the testbench to the port. It is further appreciated that the generated bypass module outputs the analog output from the port to the testbench. In other words in some nonlimiting examples, the generated bypass module is a piece of code assigning an input analog value to a port of a primitive using a signaling scheme with greater than 2 values and further receiving an output analog value from the port of the primitive and passing the output analog value to the testbench.

At step 160, a user may optionally be prompted to insert the bypass module in the testbench. In some nonlimiting examples, the bypass module may automatically be inserted into the testbench. At step 170, the hierarchical path to the leaf nodes with respect to the testbench are recalculated. At step 180, the bypass module is inserted parallel to the electronic design for the DUT. At step 190, the simulation may be relaunched, e.g., in response to a user selection thereof, automatically, etc. At step 192, an error message may be rendered in response to detecting a presence of a hierarchical bypass port (i.e. for bypass module) and further in response to detecting that the bypass module has not been inserted into the testbench.

Figure 2A:
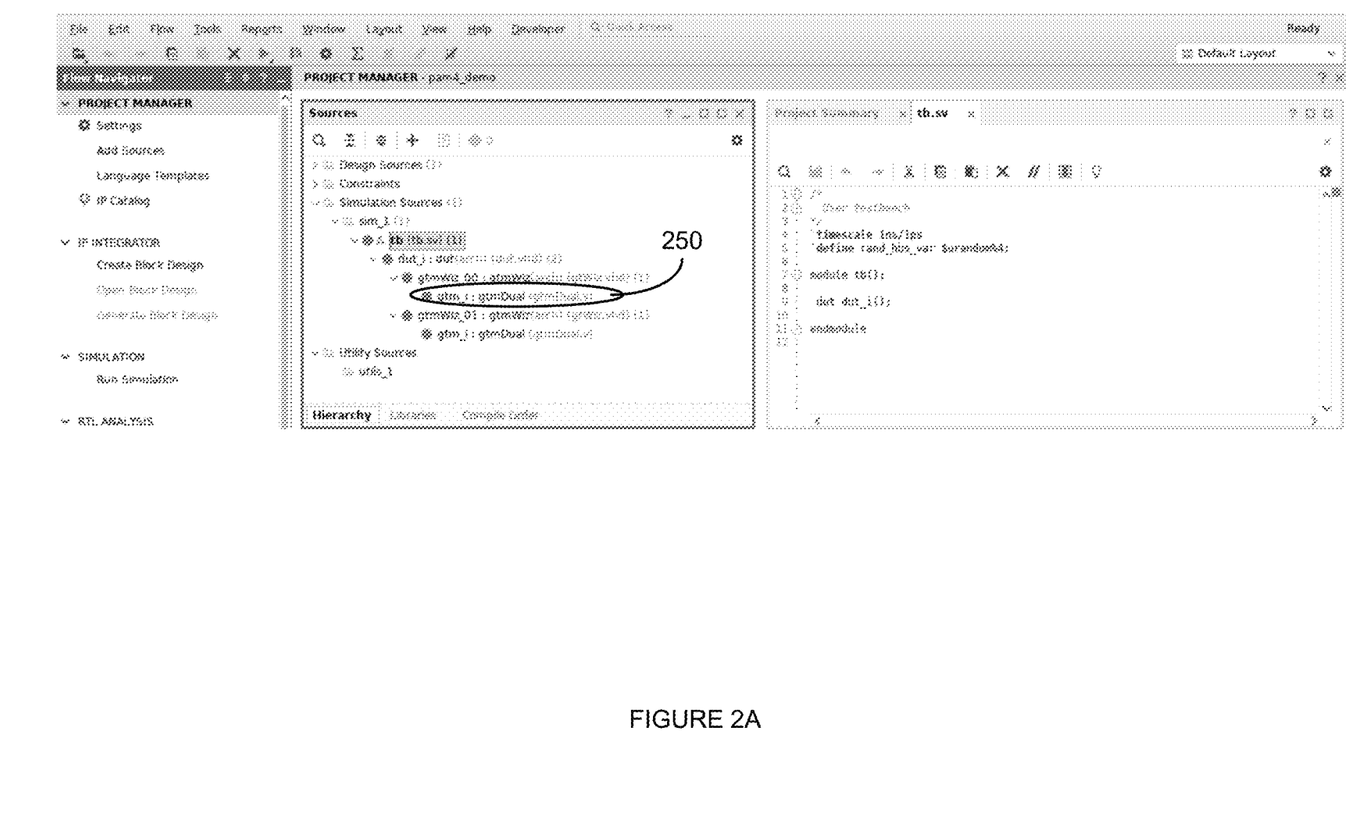
FIGS. 2A-2E show illustrative screenshots and interaction of a testbench with a DUT through a bypass module and simulation thereof, according to some examples.

FIGS. 2A-2E show illustrative screenshots and interaction of a testbench with a DUT through a bypass module and simulation thereof, according to some examples. Referring to FIG. 2A, an electronic design in HDL is shown. In this nonlimiting example and for illustrative purposes only, gtm_i: gtmDual (gtmDual.v) 250 illustrates a primitive using an analog PAM4 port.

Figure 2B:
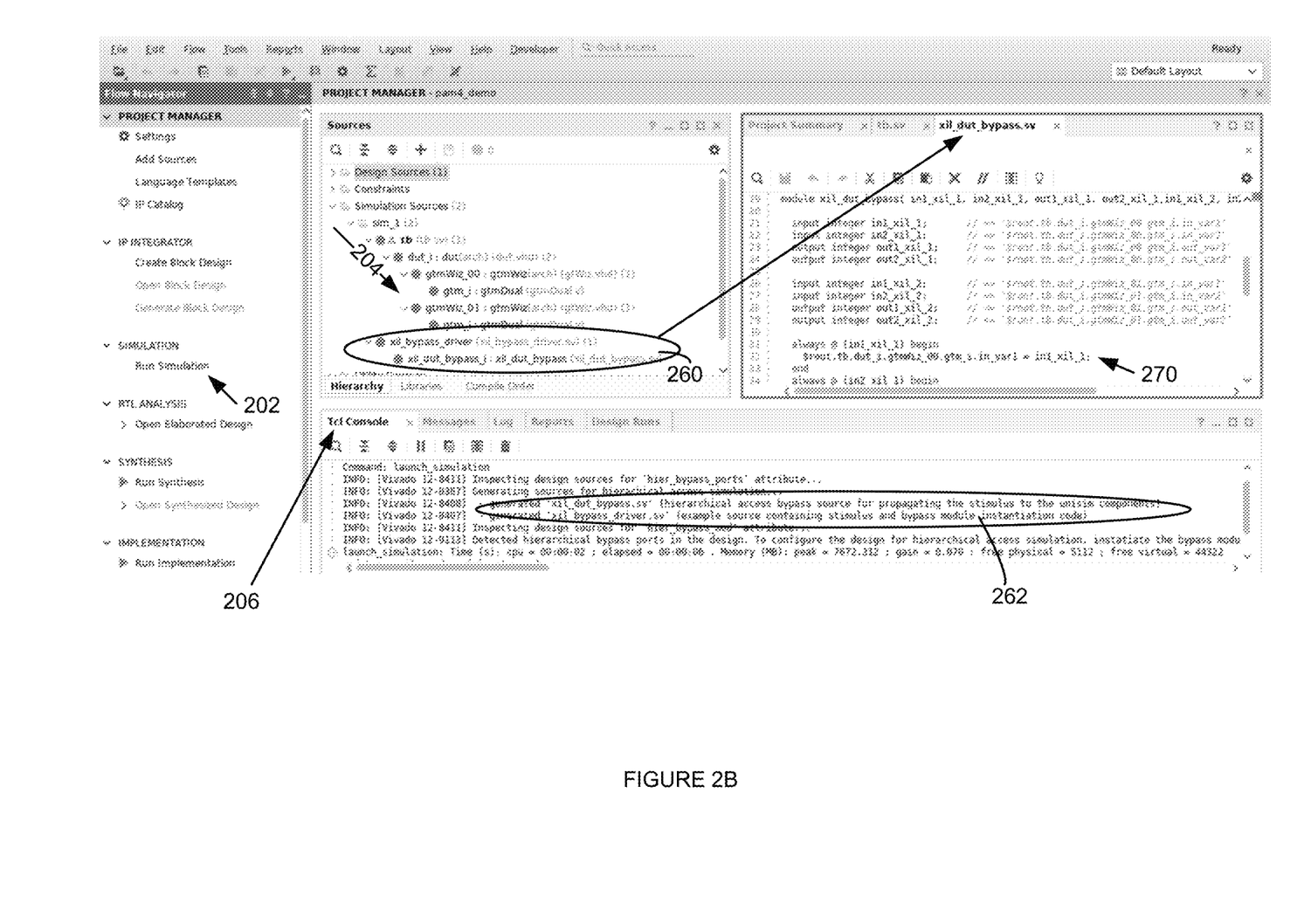

Referring now to FIG. 2B, the simulation is instantiated and launched 202, e.g., by a user. It is appreciated that a TCL console 206 will be launched and the simulation flow begins. The hierarchical path 204 for each node (primitive) is calculated, e.g., using a design-graph API. According to some embodiments, presence of any leaf node (i.e. primitive) using a signaling scheme with more than two values is detected and a bypass module and a bypass driver 260 are automatically generated. It is appreciated that the bypass module and bypass driver 260 include a hierarchical path 270 to PAM4 primitive with analog ports. Creation of the bypass module and the bypass driver 262 is reflected in the TCL console 206.

Figure 2C:
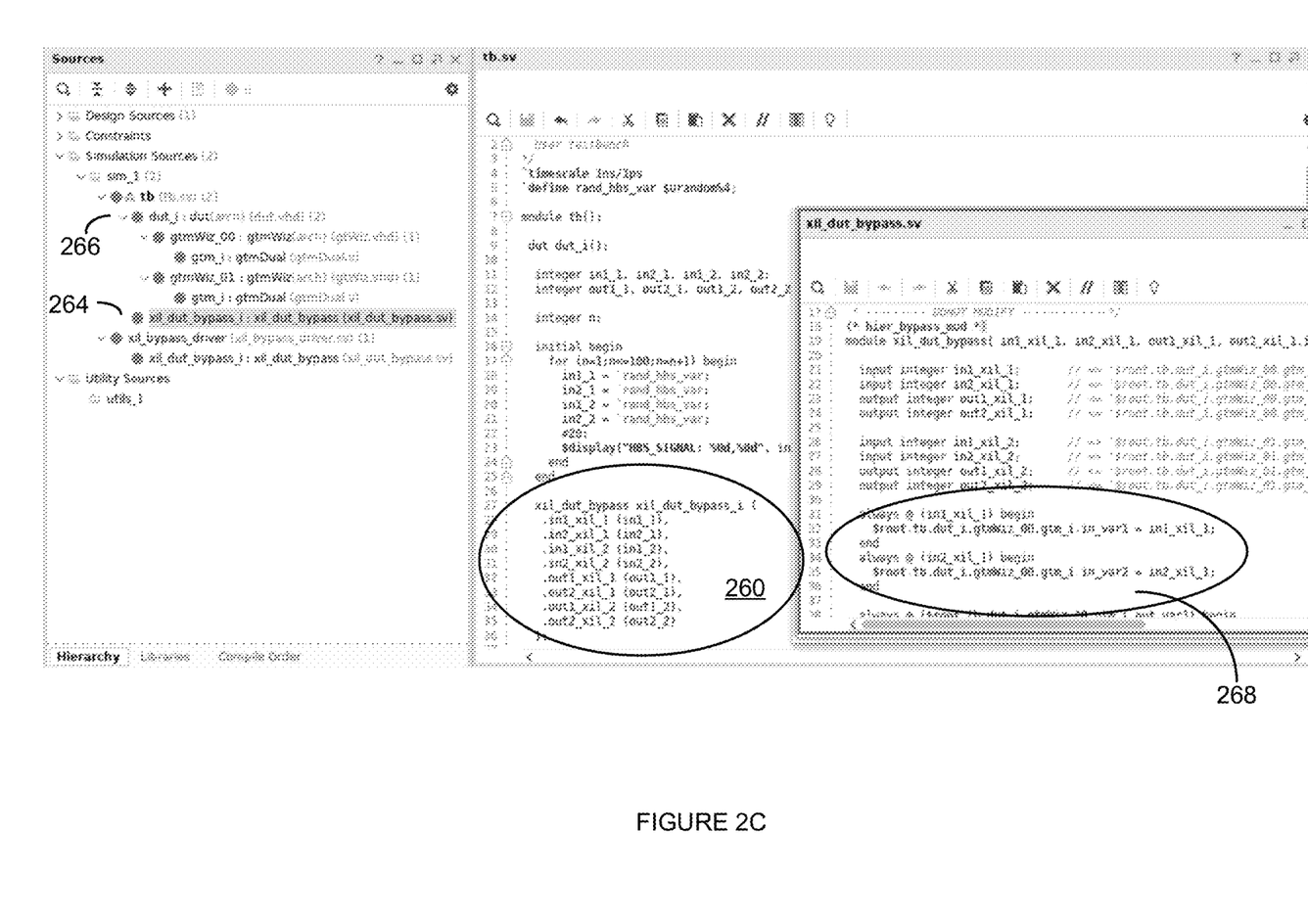

Referring now to FIG. 2C, the bypass module and the driver 260 may be inserted into the testbench parallel to the electronic design of the DUT. According to some embodiments, the user may be prompted to insert the generated bypass module into the testbench. It is appreciated that the bypass module 264 is instantiated in the top level testbench to create a parallel hierarchy with respect to the DUT 266. It is appreciated that the signaling scheme with greater than two values is propagated from the testbench to the bypass module port and finally to the PAM4 port (in this nonlimiting example) using the hierarchical path. Similarly, the primitive output from the PAM4 port propagates to the testbench using the bypass module port. It is appreciated that a signal value for a signaling scheme greater than two values may be assigned to a primitive using a hierarchical assignment 268. Once the bypass module is inserted into the testbench, the simulation may be relaunched.

It is appreciated that whether the bypass module is inserted or not, the simulation may be instantiated again. As such, a hierarchical path to the primitives may be recalculated with respect to the testbench. In some embodiments, the bypass module is inserted, as described above.

Figure 2D:
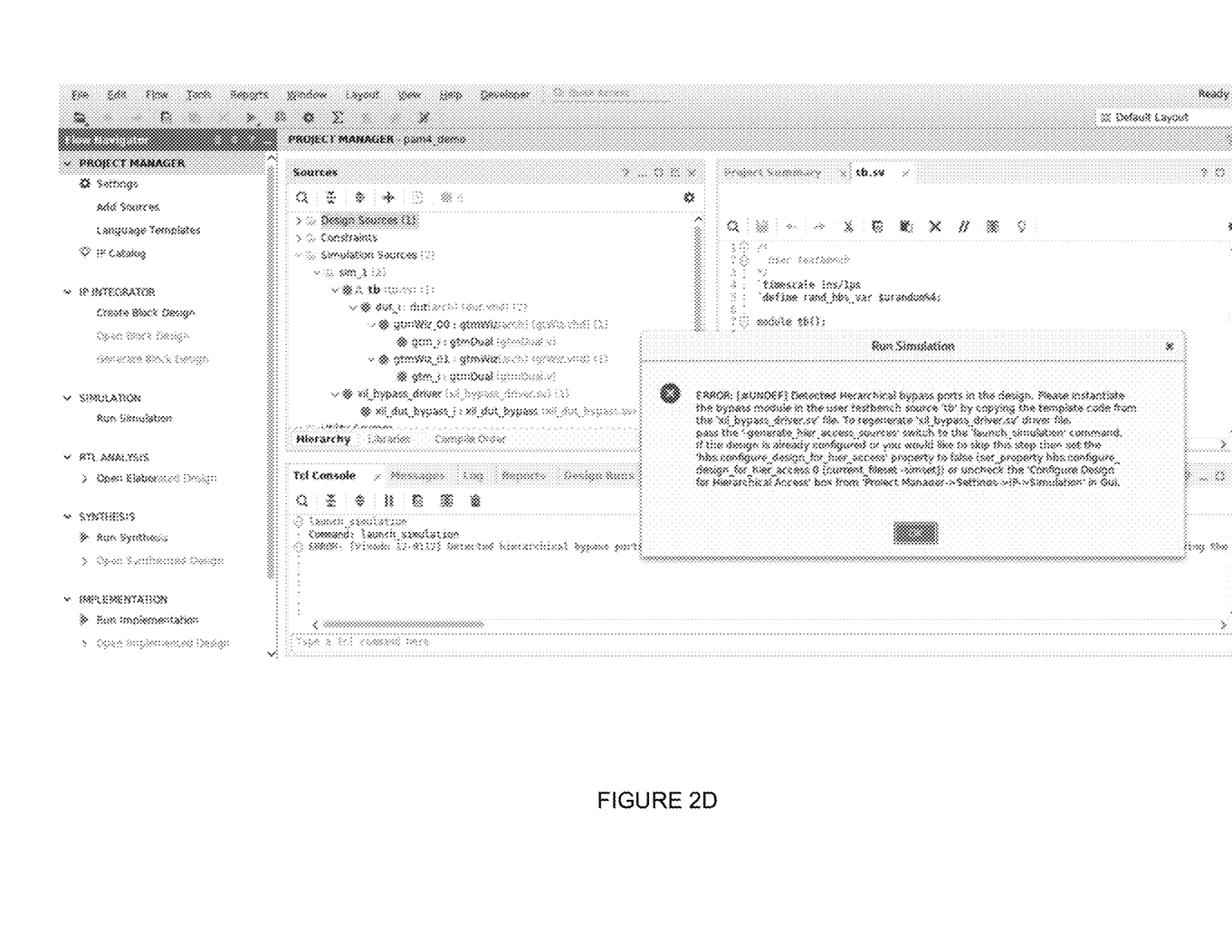

Referring now to FIG. 2D, an error message may be rendered if a bypass module is generated for one or more primitives having a signaling scheme with more than two values that is not inserted into the testbench. The error message may indicate to the user that in order to instantiate and run the simulation the generated bypass module should be inserted into the testbench.

Figure 2E:
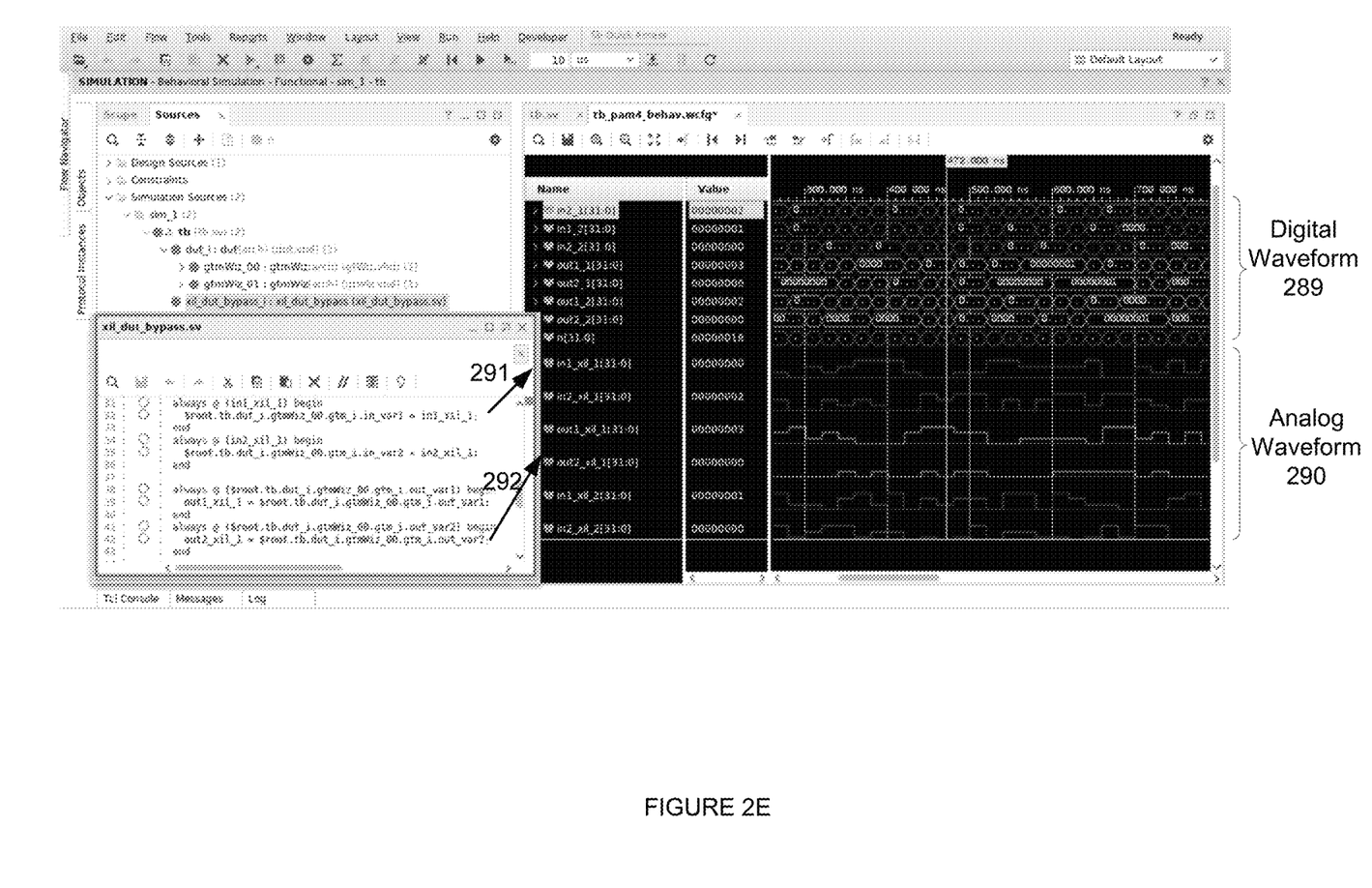

Referring now to FIG. 2E, an illustrative simulation waveform generated after the generated bypass module is inserted into the testbench, according to some embodiments is shown. The simulation presented herein is for illustrative purposes only and should not be construed as limiting the embodiments. In one nonlimiting example, the digital waveform 289 for the design is formed as well as the analog waveform 290. It is appreciated that a code segment 291 of the generated bypass module assigns input analog values from the testbench to the port, e.g., in1_xil_1. It is further appreciated that a code segment 292 of the generated bypass module outputs the analog output out_var2 to the testbench via port out2_xil_1, as an example.

Figure 3:
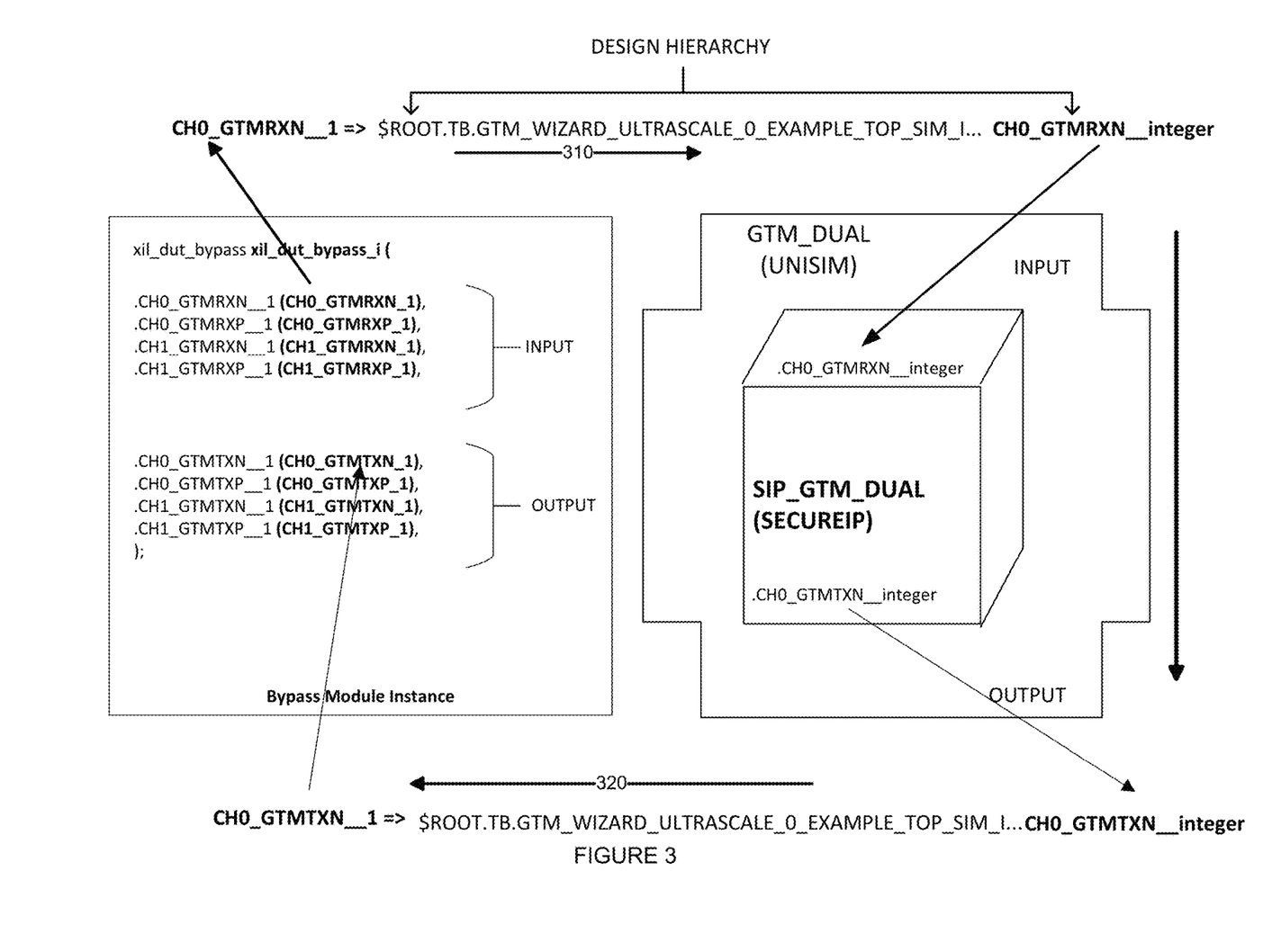
FIG. 3 illustrates a hierarchical path connection from a testbench to a primitive, according to some examples.

FIG. 3 illustrates a hierarchical path connection from a testbench to a primitive according to some embodiments. In this nonlimiting example, an input port for a bypass module having a hierarchical path 310 is illustrated. The hierarchical path 310 illustrates the path that the primitive receives a signal value from the testbench, via the bypass module. In this nonlimiting example, an output port for the bypass module having a hierarchical path 320 is illustrated. The hierarchical path 320 illustrates the path that the primitive outputs as a signal to the testbench, via the bypass module.

Figure 4A:
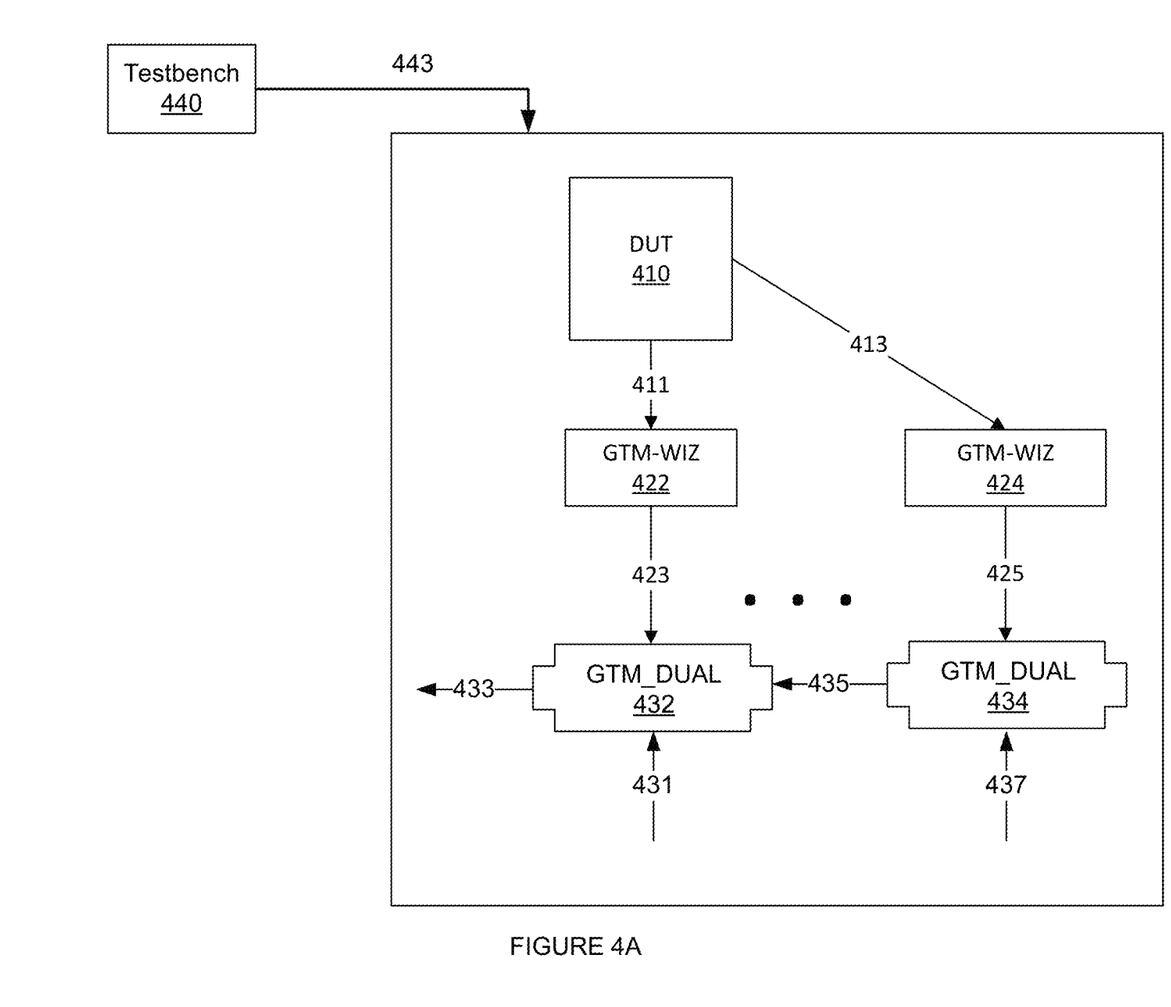
FIGS. 4A-4B illustrate a user design with two analog components and establishment of an external hierarchical access path using a bypass module, according to some examples.

FIGS. 4A-4B illustrate a user design with two analog components and establishment of an external hierarchical access path using a bypass module, according to some examples. Referring to FIG. 4A, a user design that includes two instances of signaling scheme with greater than two values is shown. In this nonlimiting example, a hierarchical path for each primitive is illustrated. For example, DUT 410 may be connected to the GTM_DUAL 432 via GTM-WIZ 422 while DUT 410 may be connected to the GTM_DUAL 434 via GTM-WIZ 424. Signals 411, 413, 423, and 425 are digital signals while signals 431, 433, 435, and 437 are analog signaling scheme. The testbench 440 communicates 443 to the DUT 410 using the illustrated hierarchical structure. As illustrated, the testbench is unable to communicate any signal other than a 2-value signal to the DUT 410 and the primitives 432 and 434.

Figure 4B:
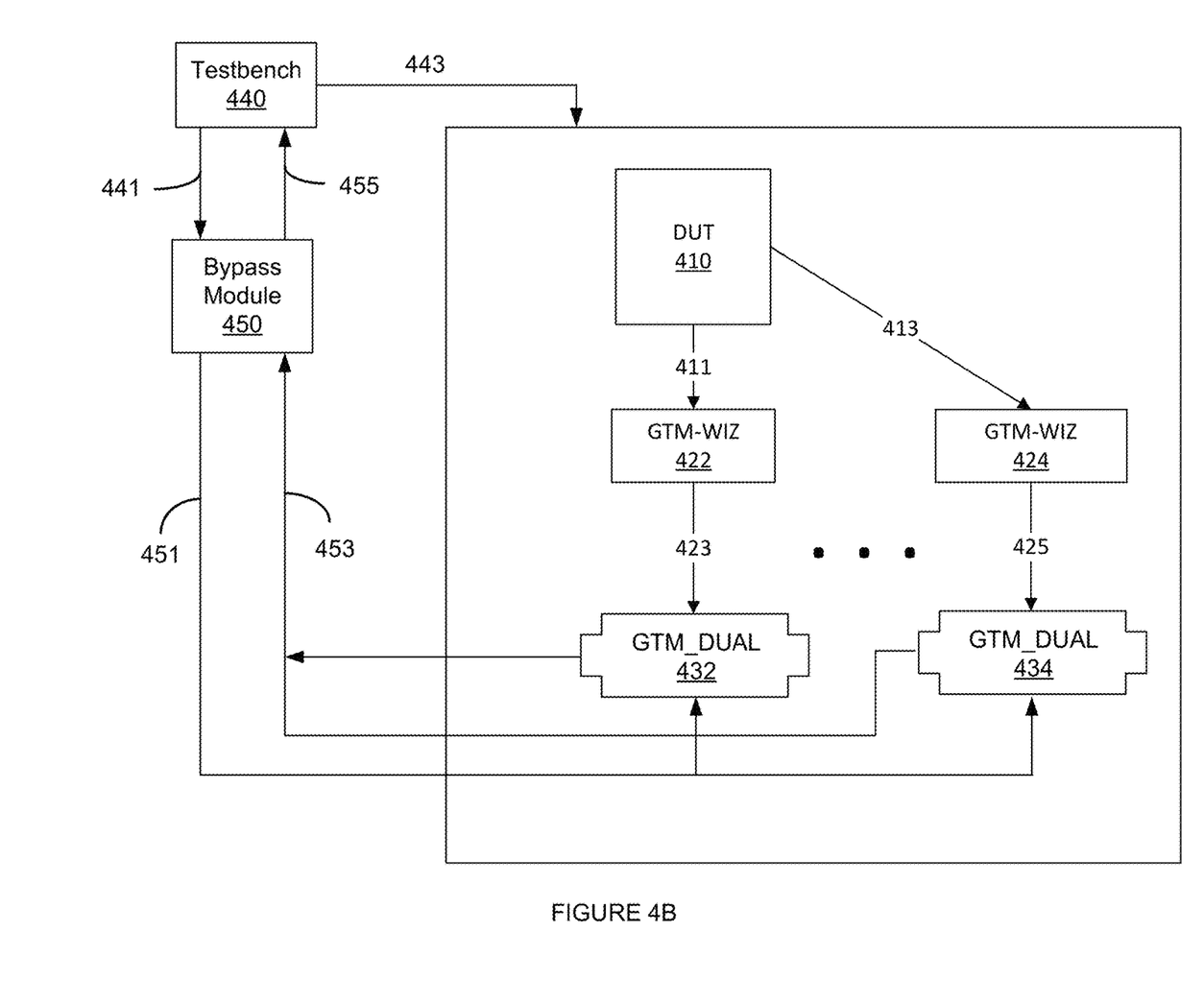

Referring now to FIG. 4B, a user design with a bypass module 450 generated is illustrated. It is appreciated that the bypass module 450 may be generated, as described above. In this nonlimiting example, the testbench 440 communicates any signaling scheme with 2 values directly to the DUT 410 whereas any signaling scheme with greater than 2 values is propagated from the testbench 440 to the primitives using the signaling scheme with greater than 2 values using the bypass module 450 and vice versa. For example, signaling schemes with more than 2-values 441, 455, 451, and 453 are communicated between the testbench 440 and the primitives, e.g., GTM_DUAL 432 and 434, using signaling scheme with more than two values via the bypass module 450.

It is appreciated that the bypass module may be generated when a user selects to run a simulation. In some nonlimiting examples, the bypass module is generated using a TCL based helper utility that calls the design-graph API. Accordingly, the hierarchical path information that may include port information of the PAM4 primitive, as an example, is fetched. The primitives with analog ports (any port with greater than 2 values) may be marked in the primitive libraries with a special attribute (hence greater than 2 values) that contains the port information. A syntax of the design-graph API is illustrated below as a nonlimiting example.

<hierarchical-path>#<input-port-specification> <output-port-specification>
<hierarchical-path>#<input-port-specification> <output-port-specification>
. . .
<hierarchical-path>#<input-port-specification> <output-port-specification>
$root.tb.dut_i.gtmWiz_00.gtm_i#in:integer:in1:in_var1 in:integer:in2:in_var2 out:integer:out1:out_var1 out:integer:out2:out_var2
$root.tb.dut_i.gtmWiz_01.gtm_i#in:integer:in1:in_var1 in:integer:in2:in_var2 out:integer:out1:out_var1 out:integer:out2:out_var2

It is appreciated that in some nonlimiting examples, the utility processes the hierarchical path information and creates a file that is added and instantiated in the testbench. As such, communication between the testbench and primitives with greater than 2 values, e.g., PAM4 ports, is established. In other words, the utility is a conversion code that translates the design hierarchical path/port information into the architecture, e.g., HDL source.

Figure 5:
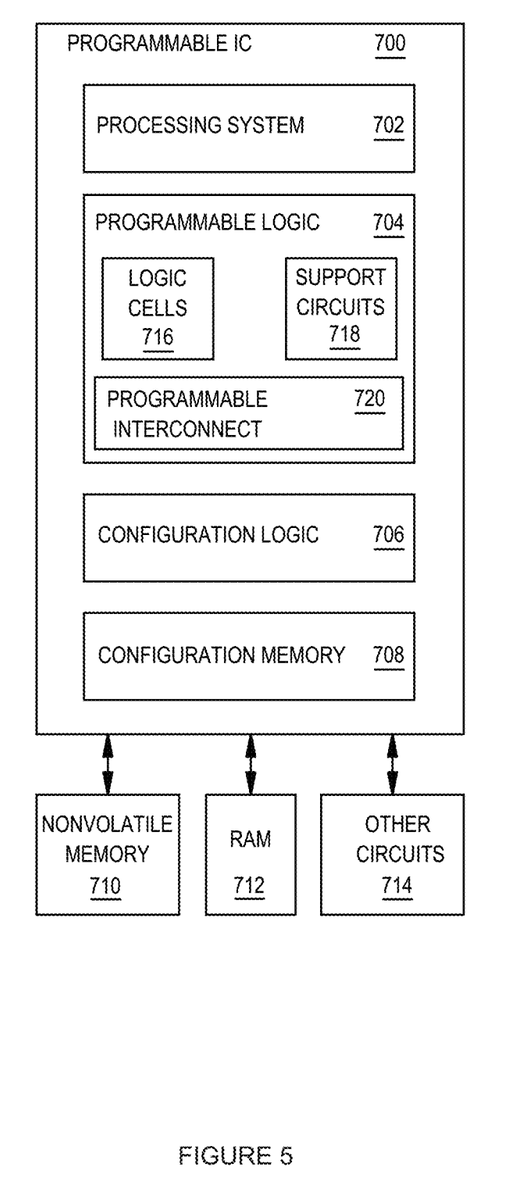
FIG. 5 is a block diagram depicting a programmable integrated circuit (IC), according to some examples.

FIG. 5 is a block diagram depicting a programmable integrated circuit (IC) 700 according to an example. The programmable IC 700 can implement the integrated circuit (IC) chip of systems of FIGS. 1-4B, in whole or in part. The programmable IC 700 includes a processing system 702, programmable logic 704, configuration logic 706, and configuration memory 708. The programmable IC 700 can be coupled to external circuits, such as nonvolatile memory 710, RAM 712, and other circuits 714.

In the illustrated example, the processing system 702 can include microprocessor(s), memory, support circuits, IO circuits, and the like. The programmable logic 704 includes logic cells 716, support circuits 718, and programmable interconnect 720. The logic cells 716 include circuits that can be configured to implement general logic functions of a plurality of inputs. The support circuits 718 include dedicated circuits, such as transceivers, input/output blocks, digital signal processors, memories, and the like. The logic cells and the support circuits 718 can be interconnected using the programmable interconnect 720. Information for programming the logic cells 716, for setting parameters of the support circuits 718, and for programming the programmable interconnect 720 is stored in the configuration memory 708 by the configuration logic 706. The configuration logic 706 can obtain the configuration data from the nonvolatile memory 710 or any other source (e.g., the RAM 712 or from the other circuits 714).

Figure 6:
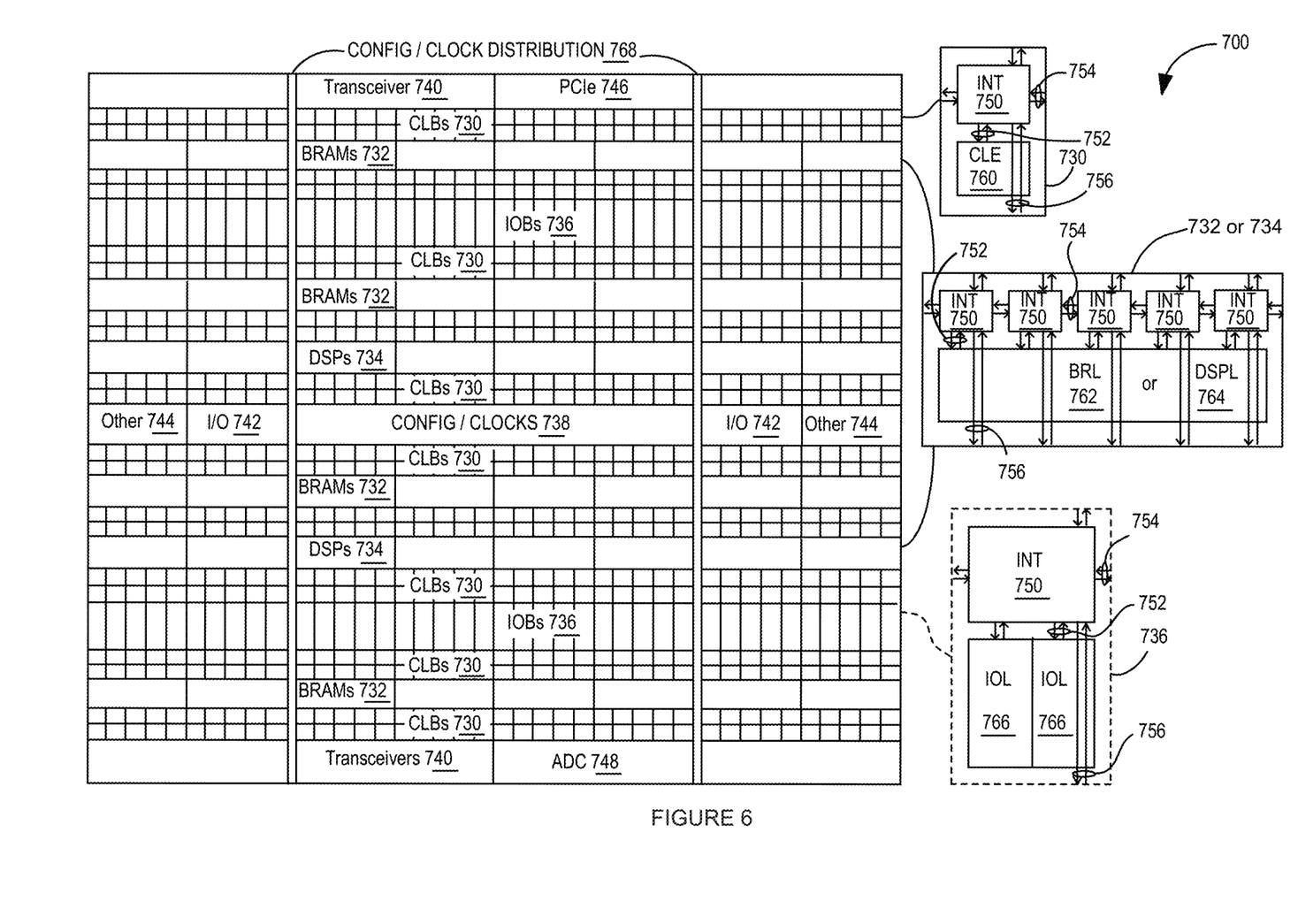
FIG. 6 is a field programmable gate array (FPGA) implementation of the programmable IC, according to some examples.

FIG. 6 illustrates an FPGA implementation of the programmable IC 700 that includes a large number of different programmable tiles including configurable logic blocks ("CLBs") 730, random access memory blocks ("BRAMs") 732, signal processing blocks ("DSPs") 734, input/output blocks ("IOBs") 736, configuration and clocking logic ("CONFIG/CLOCKS") 738, digital transceivers 740, specialized input/output blocks ("I/O") 742 (e.g., configuration ports and clock ports), and other programmable logic 744 such as digital clock managers, system monitoring logic, and so forth. The FPGA can also include PCIe interfaces 746, analog-to-digital converters (ADC) 748, and the like.

In some examples, each programmable tile in an FPGA can include at least one programmable interconnect element ("INT") 750 having connections to input and output terminals 752 of a programmable logic element within the same tile, as shown by examples included in FIG. 8. Each programmable interconnect element 750 can also include connections to interconnect segments 754 of adjacent programmable interconnect element(s) in the same tile or other tile(s). Each programmable interconnect element 750 can also include connections to interconnect segments 756 of general routing resources between logic blocks (not shown). The general routing resources can include routing channels between logic blocks (not shown) comprising tracks of interconnect segments (e.g., interconnect segments 756) and switch blocks (not shown) for connecting interconnect segments. The interconnect segments of the general routing resources (e.g., interconnect segments 756) can span one or more logic blocks. The programmable interconnect elements 750 taken together with the general routing resources implement a programmable interconnect structure ("programmable interconnect") for the illustrated FPGA.

In an example of implementation, a CLB 730 can include a configurable logic element ("CLE") 760 that can be programmed to implement user logic plus a single programmable interconnect element ("INT") 750. A BRAM 732 can include a BRAM logic element ("BRL") 762 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 734 can include a DSP logic element ("DSPL") 764 in addition to an appropriate number of programmable interconnect elements. An IOB 736 can include, for example, two instances of an input/output logic element ("IOL") 766 in addition to one instance of the programmable interconnect element 750. As will be clear to those of skill in the art, the actual I/O pads connected, for example, to the input/output logic element 766 typically are not confined to the area of the input/output logic element 766.

In the pictured example, a horizontal area near the center of the die is used for configuration, clock, and other control logic. Vertical columns 768 extending from this horizontal area or column are used to distribute the clocks and configuration signals across the breadth of the FPGA.

In some examples, FPGAs utilizing the architecture illustrated in FIG. 6 include additional logic blocks that disrupt the regular columnar structure making up a large part of the FPGA. The additional logic blocks can be programmable blocks and/or dedicated logic. Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method comprising:
   receiving an electronic design for a device under test (DUT) in hardware design language (HDL);
   instantiating a simulation of the electronic design;
   determining whether a signaling design with more than two values is used for at least one leaf node of a plurality of leaf nodes;
   calculating a hierarchical path to the plurality of leaf nodes of the electronic design for the DUT with respect to a testbench; and
   generating a bypass module in response to determining that the signaling design with more than two values is used for the at least one leaf node of the plurality of leaf nodes, wherein the bypass module is in HDL, wherein the bypass module facilitates communication between the testbench and the at least one leaf node and wherein the testbench communicates to other leaf nodes of the plurality of leaf nodes of the electronic design for the DUT using a signaling design with two values without communicating through the bypass module.

2. The method of claim 1 further comprising:
   re-calculating the hierarchical path to the plurality of leaf nodes with respect to the test bench; and
   inserting the bypass module parallel to the electronic design for the DUT.

3. The method of claim 2 further comprising relaunching the simulation.

4. The method of claim 1 further comprising:
   prompting a user to insert the bypass module in the testbench.

5. The method of claim 4 further comprising:
   relaunching the simulation; and
   rendering an error message in response to detecting a hierarchical bypass port and further responsive to absence of the bypass module in the testbench.

6. The method of claim 1, wherein the signaling design with more than two values is a pulse amplitude modulation 4 (PAM4) signaling or a PAM8 signaling.

7. The method of claim 1, wherein the signaling design with more than two values is an analog signaling.

8. The method of claim 1, wherein the simulation supports the signaling design with two values.

9. The method of claim 1, wherein a leaf node is a primitive and includes a Gigabit transceiver.

10. The method of claim 1, wherein the bypass module includes a sample test vector defining an input waveform.

11. The method of claim 1, wherein the hierarchical path for the testbench is calculated using a design-graph application programming interface (API).

12. The method of claim 1, wherein the calculating is for a hierarchical path of ports.

13. The method of claim 1, wherein the HDL is a very high speed integrated circuit (VHSIC) hardware description language (VHDL) or a Verilog base.

14. The method of claim 1, wherein the instantiating the simulation is responsive to a user input.

15. A method comprising:
    instantiating a simulation of an electronic design for a device under test (DUT) in hardware design language (HDL) responsive to a user selection thereof;
    identifying a subset of leaf nodes from a plurality of leaf nodes from the electronic design with input/output signaling of more than two values;
    calculating a hierarchical path for each leaf node of the plurality of leaf nodes of the electronic design for the DUT with respect to a testbench; and
    generating a bypass module associated with the subset of leaf nodes, wherein the bypass module is generated in response to detecting presence of the subset of leaf nodes in the electronic design with input/output signaling of more than two values, wherein the bypass module facilitates communication between the testbench and the subset of leaf nodes and wherein leaf nodes other than the subset of leaf nodes communicate with the testbench without communicating through the bypass module.

16. The method of claim 15, wherein the bypass module is in HDL.

17. The method of claim 15 further comprising:
    re-calculating the hierarchical path to the plurality of leaf nodes with respect to the test bench; and
    inserting the bypass module parallel to the electronic design for the DUT.

18. The method of claim 17 further comprising relaunching the simulation.

19. The method of claim 15 further comprising:
    prompting a user to insert the bypass module in the testbench.

20. The method of claim 19 further comprising:
    relaunching the simulation; and
    rendering an error message in response to detecting a hierarchical bypass port and further responsive to absence of the bypass module in the testbench.

* * * * *